(12) United States Patent
Stanton et al.

(10) Patent No.: US 8,547,526 B2
(45) Date of Patent: Oct. 1, 2013

(54) PHOTOLITHOGRAPHY SYSTEMS AND ASSOCIATED METHODS OF SELECTIVE DIE EXPOSURE

(75) Inventors: William A. Stanton, Beaverton, OR (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1000 days.

(21) Appl. No.: 12/419,744

(22) Filed: Apr. 7, 2009

(65) Prior Publication Data

US 2010/0253929 A1    Oct. 7, 2010

(51) Int. Cl.
*G03B 27/72* (2006.01)

(52) U.S. Cl.
USPC .......................................................... 355/71

(58) Field of Classification Search
USPC ...................................................... 355/67, 71
See application file for complete search history.

(56) References Cited

U.S. PATENT DOCUMENTS

| | | | |
|---|---|---|---|
| 5,106,764 A | | 4/1992 | Harriott et al. |
| 5,793,471 A | * | 8/1998 | Kanda et al. ................. 355/53 |
| 6,288,772 B1 | | 9/2001 | Shinozaki et al. |
| 6,461,797 B1 | | 10/2002 | Lercel et al. |
| 2005/0219482 A1 | * | 10/2005 | Baselmans et al. ............ 355/30 |
| 2008/0160431 A1 | | 7/2008 | Scott et al. |

FOREIGN PATENT DOCUMENTS

JP    2005045160 A  *  2/2005

OTHER PUBLICATIONS

United States Statutory Invention Registration No. H1525, Geil et al., Apr. 2, 1996.

* cited by examiner

*Primary Examiner* — Glen Kao
(74) *Attorney, Agent, or Firm* — Perkins Coie LLP

(57) ABSTRACT

Several embodiments of photolithography systems and associated methods of selective die exposure are disclosed herein. In one embodiment, a method for exposing a microelectronic substrate in a photolithography system includes producing an illumination radiation from a radiation source and identifying a field on the microelectronic substrate to be exposed. The field is partitioned into a first region discrete from a second region. The method further includes inhibiting the illumination radiation to expose the first region while simultaneously exposing the second region to the illumination radiation.

20 Claims, 5 Drawing Sheets

PHOTOLITHOGRAPHY SYSTEMS AND ASSOCIATED METHODS OF SELECTIVE DIE EXPOSURE

TECHNICAL FIELD

The present disclosure is related to photolithography devices and associated methods of selective die exposure.

BACKGROUND

Photolithography is a process commonly used in semiconductor fabrication for selectively removing portions of a thin film from or depositing portions of a film onto discrete areas of a surface of a semiconductor wafer. A typical photolithography process includes spin coating a layer of a light-sensitive material (commonly referred to as a "photoresist") onto the surface of the semiconductor wafer. The semiconductor wafer is then exposed to a pattern of light that chemically modifies a portion of the photoresist incident to the light. The process further includes removing one of either the incident portion or the non-incident portion from the surface of the semiconductor wafer with a chemical solution (e.g., a "developer") to form a pattern of openings in the photoresist on the wafer. Subsequently, portions of the thin film on the surface of the semiconductor wafer can be selectively removed from or deposited onto the surface of the wafer through the openings of the photoresist mask.

One operational difficulty with the foregoing photolithography technique is that partial patterns may be formed in a peripheral region of the semiconductor wafer because of geometric limitations. Materials in areas corresponding to the partial patterns may delaminate and/or otherwise break away from the semiconductor wafer during etching, polishing, and/or another type of subsequent processing. The resulting small particles may cause processing difficulties and/or device failure in the microelectronic devices formed in the semiconductor wafer. Accordingly, certain improvements to the photolithography process may be needed.

DETAILED DESCRIPTION

Various embodiments of photolithography systems for processing microelectronic substrates and associated methods of selective die exposure are described below. The term "microelectronic substrate" is used throughout to include substrates upon which and/or in which microelectronic devices, micromechanical devices, data storage elements, read/write components, and other features are fabricated. Microelectronic substrates can include one or more conductive and/or nonconductive layers (e.g., metallic, semiconductive, and/or dielectric layers) that are situated upon or within one another. These conductive and/or nonconductive layers can also include a wide variety of electrical elements, mechanical elements, and/or systems of such elements in the conductive and/or nonconductive layers (e.g., an integrated circuit, a memory, a processor, a microelectromechanical system, etc.). The term "photoresist" generally refers to a material that can be chemically modified when exposed to electromagnetic radiation. The term encompasses both positive photoresist that is configured to be soluble when activated by the electromagnetic radiation and negative photoresist that is configured to be insoluble when activated by light. A person skilled in the relevant art will also understand that the disclosure may have additional embodiments, and that the disclosure may be practiced without several of the details of the embodiments described below with reference to FIGS. 1-5.

Figure 1:
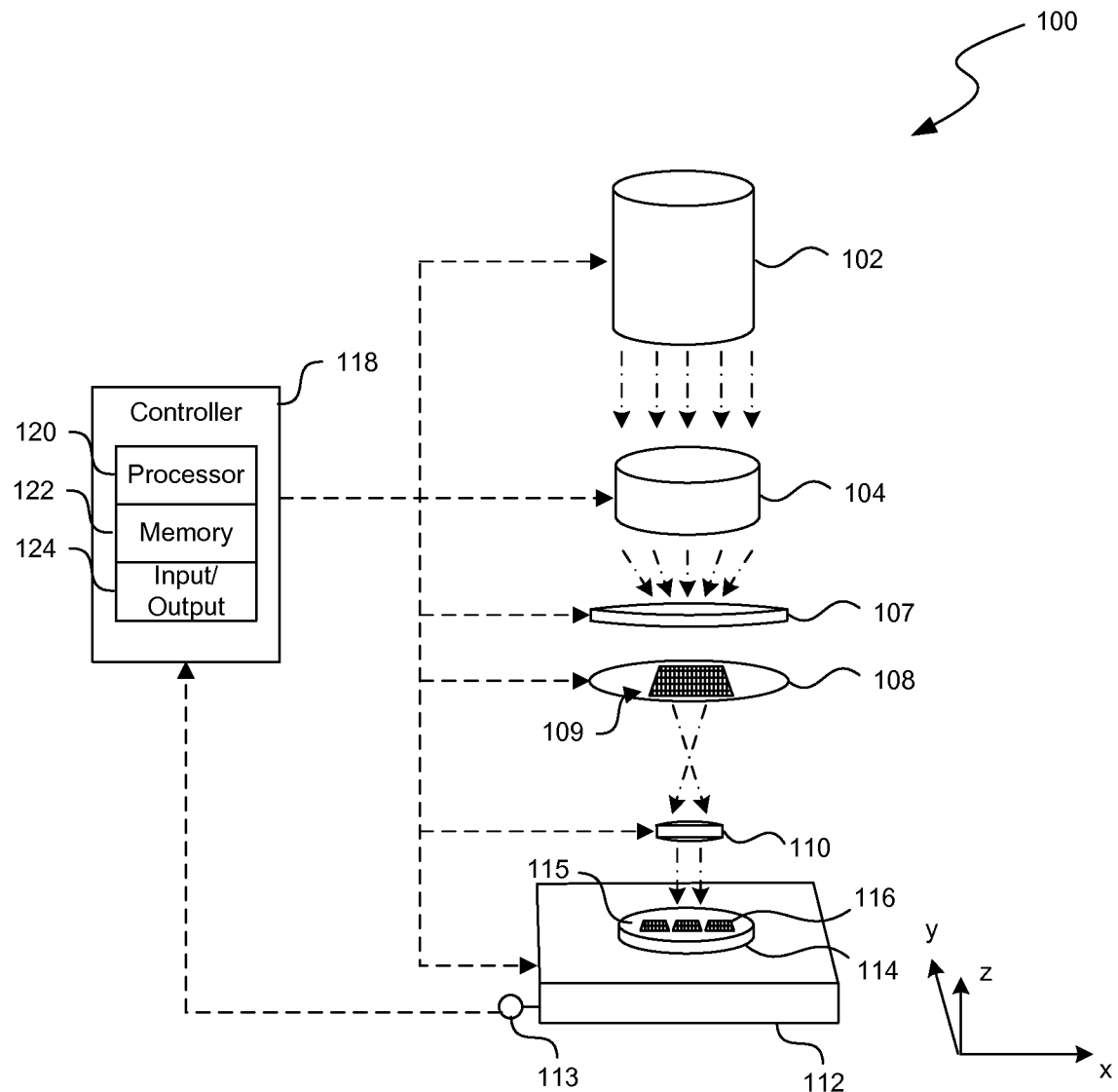
FIG. 1 is a schematic view of a photolithography system in accordance with an embodiment of the disclosure.

FIG. 1 is a schematic view of a photolithography system 100 in accordance with an embodiment of the disclosure. In the embodiment illustrated in FIG. 1, the photolithography system 100 includes a radiation source 102, a condenser lens 104, a programmable radiation filter 107, a reticle 108, an objective lens 110, and a substrate support 112 arranged in series. A controller 118 is operatively coupled to the various components of the photolithography system 100 for monitoring and/or controlling the operation of these components. In other embodiments, the photolithography system 100 can also include a substrate transport station, a structural support (e.g., a reticle support, a lens support, etc.), position sensors (e.g., a scatterometer), an immersion hood, a support actuator (e.g., an electric motor), and/or other suitable mechanical and/or electrical components.

The radiation source 102 can be configured to produce an illumination radiation or exposure energy (e.g., electromagnetic radiation). The radiation source 102 can include an ultraviolet light source (e.g., a fluorescent lamp), a laser source (e.g., an argon fluoride excimer laser), and/or other suitable electromagnetic emission sources. The radiation source 102 can also include lenses, collimators, mirrors, and/or other suitable conditioning components (not shown). In certain embodiments, the radiation source 102 can be configured to produce a generally coherent illumination at a single frequency. In other embodiments, the radiation source 102 can be at least partially incoherent. In further embodiments, the radiation source 102 can be configured to generate illumination radiation at multiple frequencies.

The condenser lens 104 can be configured to concentrate the illumination radiation from the radiation source 102 onto the reticle 108. In certain embodiments, the condenser lens 104 can include a plurality of reflective and/or refractive lenses arranged in series. In other embodiments, the condenser lens 104 can also include collimators, mirrors, and/or other suitable illumination conditioning components. The photolithography system 100 can also include actuators (e.g., electric motors) configured to move the condenser lens 104 relative to the radiation source 102 and/or the reticle 108 based on instructions from the controller 118.

The programmable radiation filter 107 can be configured to selectively attenuate, inhibit, or block the illumination radiation from reaching at least a portion of the reticle 108 and the microelectronic substrate 114. In one embodiment, the programmable radiation filter 107 includes a liquid crystal panel having a plurality of addressable pixels. The individual pixels may be independently controlled by the controller 118 to be either transparent or opaque. In another embodiment, the programmable radiation filter 107 can include an array of addressable microelectromechanical systems (MEMS). For example, one suitable component is the digital MEMS microshutter provided by Pixtronix, Inc. of Wilmington, Mass. In other embodiments, the programmable radiation filter 107 can also include other suitable radiation filters.

The reticle 108 can include an opaque plate with lines, apertures, and/or transparencies that allow the illumination radiation from the radiation source 102 to pass through in a defined pattern 109. In the illustrated embodiment, the pattern 109 includes a grating. In other embodiments, the pattern 109 can also include a collection of lines, channels, apertures, shapes, and/or other geometric elements in a suitable arrangement.

The objective lens 110 can be configured to project the illumination radiation received from the reticle 108 onto a photoresist 115 of the microelectronic substrate 114. As shown in FIG. 1, the photoresist 115 of the microelectronic substrate 114 can be divided into discrete areas (hereinafter referred to as "fields 116"). During exposure, the pattern 109 from the reticle 108 can be replicated or printed individually onto one of the fields 116. Even though the fields 116 are shown in FIG. 1 as spaced apart from one another, in other embodiments, adjacent fields 116 can be abutting one another, as described in more detail below with reference to FIG. 2. In further embodiments, the fields 116 can have other suitable arrangements relative to one another.

The substrate support 112 can be configured to carry the microelectronic substrate 114. The substrate support 112 can include a vacuum chuck, a mechanical chuck, and/or another suitable supporting device. In the illustrated embodiment, the photolithography system 100 includes at least one actuator (not shown) configured to move the substrate support 112 laterally (as indicated by the X-axis), transversely (as indicated by the Y-axis), and/or vertically (as indicated by the Z-axis) relative to the reticle 108 and/or other components of the photolithography system 100. In certain embodiments, the substrate support 112 can also include a position transmitter 113 configured to monitor the position of the substrate support 112 along the X-axis, Y-axis, and/or the Z-axis. Even though only one substrate support 112 is shown in FIG. 1, in certain embodiments, the photolithography system 100 can include two, three, or any desired number of substrate supports with structures and/or functions that are generally similar to or different from the substrate support 112.

The controller 118 can include a processor 120 coupled to a memory 122 and an input/output component 124. The processor 120 can include a microprocessor, a field-programmable gate array, and/or other suitable logic processing devices. The memory 122 can include volatile and/or nonvolatile media (e.g., ROM; RAM; magnetic disk storage media; optical storage media; flash memory devices, and/or other suitable storage media) and/or other types of computer-readable storage media configured to store data received from, as well as instructions for, the processor 120. The input/output component 124 can include a display, a touch screen, a keyboard, a mouse, and/or other suitable types of input/output devices configured to accept input from and provide output to an operator.

In certain embodiments, the controller 118 can include a personal computer operatively coupled to the other components of the photolithography system 100 via a communication link (e.g., a USB link, an Ethernet link, a Bluetooth link, etc.). In other embodiments, the controller 118 can include a network server operatively coupled to the other components of the photolithography system 100 via a network connection (e.g., an internet connection, an intranet connection, etc.) In further embodiments, the controller 118 can include a process logic controller, a distributed control system, and/or other suitable computing frameworks.

During operation, the photolithography system 100 can first receive and load a microelectronic substrate 114 onto the substrate support 112. The photolithography system 100 then exposes individual fields 116 of the microelectronic substrate 114 to the radiation source 102 to print a copy of the pattern 109 onto microelectronic substrate 114.

In certain embodiments, the photolithography system 100 can expose the individual fields 116 of the microelectronic substrate 114 in a step mode. For example, the controller 118 can energize the actuator(s) to move the substrate support 112 a discrete distance (commonly referred to as a "step") along the X-axis or the Y-axis. Once the field 116 is in position, the radiation source 102 provides an illumination radiation to the incident field 116 through the reticle 108 for a preselected period of time. The illumination radiation has a desired exposure intensity for forming patterns in the incident filed 116 during the preselected period of time. After the preselected period of time, the illumination radiation can be turned off, and the controller 118 energizes the actuator(s) to move the substrate support 112 another step along either the X-axis or the Y-axis. A subsequent field 116 is exposed in a similar fashion, and this process is repeated until all of the fields 116 are exposed.

In other embodiments, the controller 118 can operate the photolithography system 100 in a scanning mode. For example, the controller 118 can control the actuators to move the substrate support 112 continuously along the X-axis or the Y-axis at a preselected speed in a first direction or a second direction opposite the first direction. As the fields 116 move along the X-axis or the Y-axis, the radiation source 102 provides the illumination radiation to the photoresist 115 on the microelectronic substrate 114 to print a copy of the pattern 109 onto the individual fields 116. In further embodiments, the controller 118 can cause the photolithography system 100 to operate in a combination of the step mode and the scanning mode.

After all the fields 116 on the microelectronic substrate 114 are exposed, the microelectronic substrate 114 can be removed from the substrate support 112 and can undergo photoresist developing, baking, cleaning, and/or another type of suitable processing. A subsequent microelectronic substrate 114 can then be loaded onto the substrate support 112, and the foregoing exposure procedures can be repeated until a desired number of microelectronic substrates have been processed.

Figure 2:
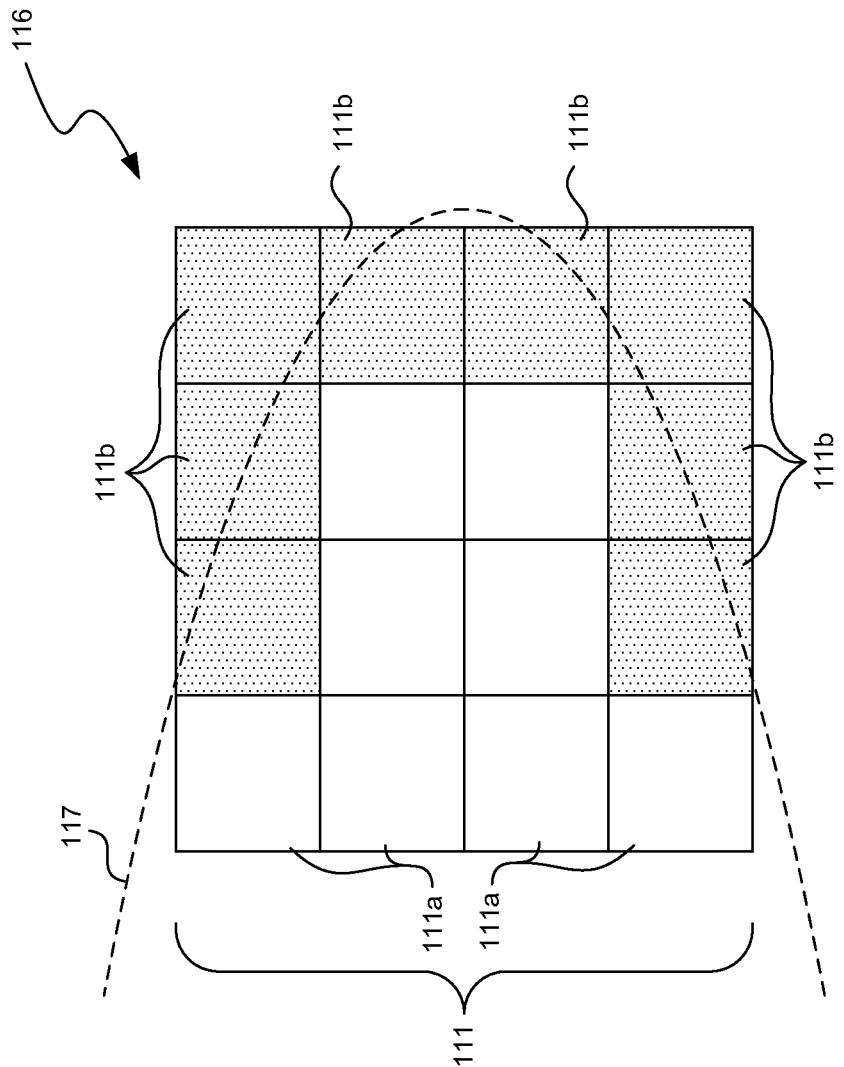
FIG. 2 is an enlarged view of a microelectronic substrate being processed in the photolithography system of FIG. 1 in accordance with an embodiment of the disclosure.

Conventional implementations of the foregoing technique may not adequately account for partial patterns formed on the peripheral regions of the microelectronic substrate 114. FIG. 2 is an enlarged view of the microelectronic substrate 114 being processed in the photolithography system 100 of FIG. 1. As shown in FIG. 2, the field 116 includes an array of regions 111 individually corresponding to a die and/or other microelectronic device. Sixteen patterns are shown for illustration purposes although the field 116 can include any other number of regions. The microelectronic substrate 114 includes a peripheral edge 117 that intercepts at least some of the regions 111. As a result, the regions 111 can be separated into a first group of regions 111a that are not intercepted by or overlap with the peripheral edge 117 (hereinafter referred to as "normal regions 111a") and a second groups of regions 111b that are at least partially intercepted by or overlapped with the peripheral edge 117 (hereinafter referred to as "partial regions 111b"). Even though a particular combination of the normal and partial regions 111a and 111b are illustrated in FIG. 2, in other embodiments, the field 116 can have other combinations of the normal and partial regions 111a and 111b.

Without being bound by theory, it is believed that the partial regions 111b may have layers of material with different adhesion properties than the normal regions 111a do because of processing differences between the central region and the peripheral region of the microelectronic substrate 114. For example, during a plasma deposition process, the plasma density proximate to the central region may be stronger than that proximate to the peripheral region of the microelectronic substrate 114. In another example, during a chemical-mechanical polishing process, the peripheral region may be subject to more aggressive removal rates than the central region. As a result, thinner and/or weaker layers may exist in the partial regions 111b than in the normal regions 111a. Thus, during subsequent processing, the layers of material in the partial regions 111b may delaminate and break off from the microelectronic substrate 114. The resulting small particles may cause short circuits, contaminate the microelectronic substrate 114, and/or result in other fabrication difficulties.

Conventional techniques for addressing the foregoing operational difficulty include (1) not printing on any fields 116 that have at least one partial region 111b, or (2) removing the small particles during each stage of a fabrication process. Avoiding printing any fields 116 that have at least one partial region 111b, however, reduces the product yield because this technique also does not print the normal regions 111a. Removing the small particles during each stage of a fabrication process is also undesirable because it adds to the complexity and cost of the fabrication process.

Referring to FIGS. 1 and 2 together, several embodiments of the photolithography system 100 can address the foregoing operation difficulty by controlling the programmable radiation filter 107 to selectively expose the normal regions 111a in the field 116 while simultaneously at least attenuating, inhibiting, or blocking the illumination radiation from exposing the partial regions 111b. During an initial processing stage, an operator can develop a map (hereinafter referred to as the "workpiece map") of the microelectronic substrate 114 based on the geometry of the microelectronic substrate 114, a configuration of the fields 116, and/or other suitable parameters. The workpiece map can include dimensions, locations, and/or other information of individual regions 111 and fields 116 based on a selected reference point (e.g., a marker on the microelectronic substrate 114). The operator can then store the workpiece map in the memory 122 and/or another suitable storage location.

During exposure, the controller 118 can monitor the location of each field 116 to be exposed based on (1) input from the position transmitter 113 and/or other suitable sensors and (2) the workpiece map. The controller 118 then determines whether the current field 116 includes any partial regions 111b based at least in part on the location of the field 116 and the information in the workpiece map. If the controller 118 determines that the current field 116 does not include any partial regions 111b, the controller 118 provides an output to the programmable radiation filter 107 to allow the illumination radiation to pass through to the reticle 108.

If the controller 118 determines that the current field 116 does include at least one partial region 111b, the controller 118 then determines an area (e.g., pixels, microshutters, etc.) in the programmable radiation filter 107 that corresponds to the partial regions 111b based at least in part on the configuration of the programmable radiation filter 107 and the workpiece map. For example, in certain embodiments, a group of pixels or microshutters may be assigned to a particular region of the current field 116. In other embodiments, areas of the programmable radiation filter 107 may correspond to regions in the field 116 in other suitable manners.

The controller 118 can then provide an output to the programmable radiation filter 107 to at least attenuate, inhibit, or block the illumination radiation from passing through the determined area of the programmable radiation filter 107 while allowing the illumination radiation to pass through other areas. For example, in one embodiment, the programmable radiation filter 107 can reduce the intensity of the illumination radiation passing through the determined area to a level less than the desired exposure intensity. In another embodiment, the programmable radiation filter 107 can reduce the intensity of the illumination radiation passing through the determined area to approximately zero. In other embodiments, the programmable radiation filter 107 can reduce the intensity of the illumination radiation to other suitable levels.

Several embodiments of the photolithography system 100 can at least reduce or prevent printing in the partial regions 111b while permitting printing in normal regions 111a within the same field 116 of the microelectronic substrate 114. As a result, several embodiments of the photolithography system 100 can have a higher product yield than conventional systems. Moreover, several embodiments of the photolithography system 100 can also reduce contaminants in the fabrication process because the partial regions 111b are not formed, and so little or no material may break off from these regions of the microelectronic substrate 114 during subsequent processing.

Even though the programmable radiation filter 107 is illustrated in FIG. 1 as between the condenser lens 104 and the reticle 108, in other embodiments, the programmable radiation filter 107 can also be at other locations. For example, in certain embodiments, the programmable radiation filter 107 can be between the radiation source 102 and the condenser lens 104, between the reticle 108 and the objective lens 110, or between the objective lens 110 and the microelectronic substrate 114. In further embodiments, the programmable radiation filter 107 may be incorporated into the radiation source 102, the condenser lens 104, the reticle 108, or the objective lens 110.

Figure 3:
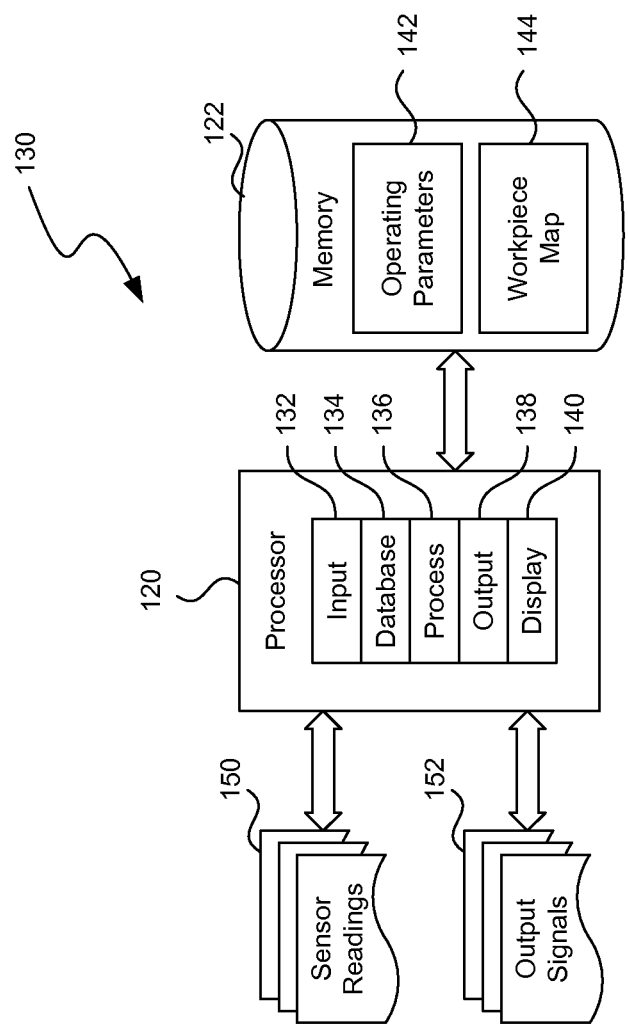
FIG. 3 is a block diagram showing computing system software modules suitable for the photolithography system of FIG. 1 in accordance with embodiments of the disclosure.

FIG. 3 is a block diagram showing computing system software modules 130 suitable for the controller 118 of FIG. 1 in accordance with embodiments of the disclosure. Each component may be a computer program, procedure, or process written as source code in a conventional programming language, such as the C++ programming language, and may be presented for execution by the processor 120 (FIG. 1) of the controller 118. The various implementations of the source code and object byte codes may be stored in the memory 122 (FIG. 1). The software modules 130 of the controller 118 may include an input module 132, a database module 134, a process module 136, an output module 138, and, optionally, a display module 140 interconnected with one another.

During operation, the input module 132 accepts an operator input, such as a process setpoint (e.g., the Z-axis offset for the substrate support 112) and control selections (e.g., selection for step mode or scanning mode), and communicates the accepted information or selections to other components for further processing. The database module 134 organizes records, including operating parameters 142 and a workpiece map 144, and facilitates storing and retrieving of these records to and from the memory 122. The workpiece map 144 may include measured and/or derived location information for the microelectronic substrate 114, as described in more detail below with reference to FIG. 4. Any type of database organization may be utilized, including a flat file system, hierarchical database, relational database, or distributed database, such as provided by a database vendor such as the Oracle Corporation, Redwood Shores, Calif.

The process module 136 generates control variables based on sensor readings 150 from sensors (e.g., the position transmitter 113 of the substrate support 112 in FIG. 1) and/or other data sources, and the output module 138 generates output signals 152 based on the control variables. The processor 120 optionally may include the display module 140 for displaying, printing, or downloading the sensor readings 150, the output signals 152, and/or other information via a monitor, a printer, and/or other suitable devices.

Figure 4:
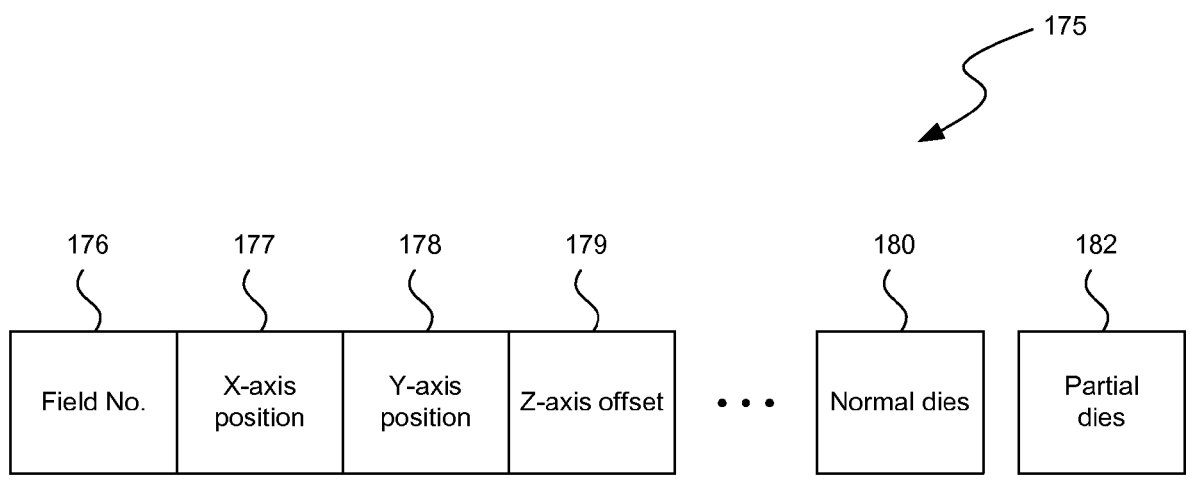
FIG. 4 is a database schema illustrating an organization of a workpiece map in accordance with embodiments of the disclosure.

FIG. 4 is a database schema illustrating an organization of a workpiece record 175 stored as a part of the workpiece map 144 in the memory 122 of the controller 118 in FIG. 1. In the illustrated embodiment, only the information pertaining to the set of location information in the workpiece map 144 is shown for purpose of clarity. As shown in FIG. 4, the workpiece record 175 can include the following information: a field number 176, an X-axis position 177, a Y-axis position 178, a Z-axis offset 179, normal dies 180, and partial dies 182. The normal dies 180 can include the number of normal dies in the field, locations of the individual normal dies, and/or other suitable information. The partial dies 182 can include a flag indicating whether a field contains partial dies, a number of partial dies, the locations of the individual partial dies, and/or other suitable information. In other embodiments, the workpiece record 175 can also include historical data and/or other pertinent data (not shown).

Figure 5:
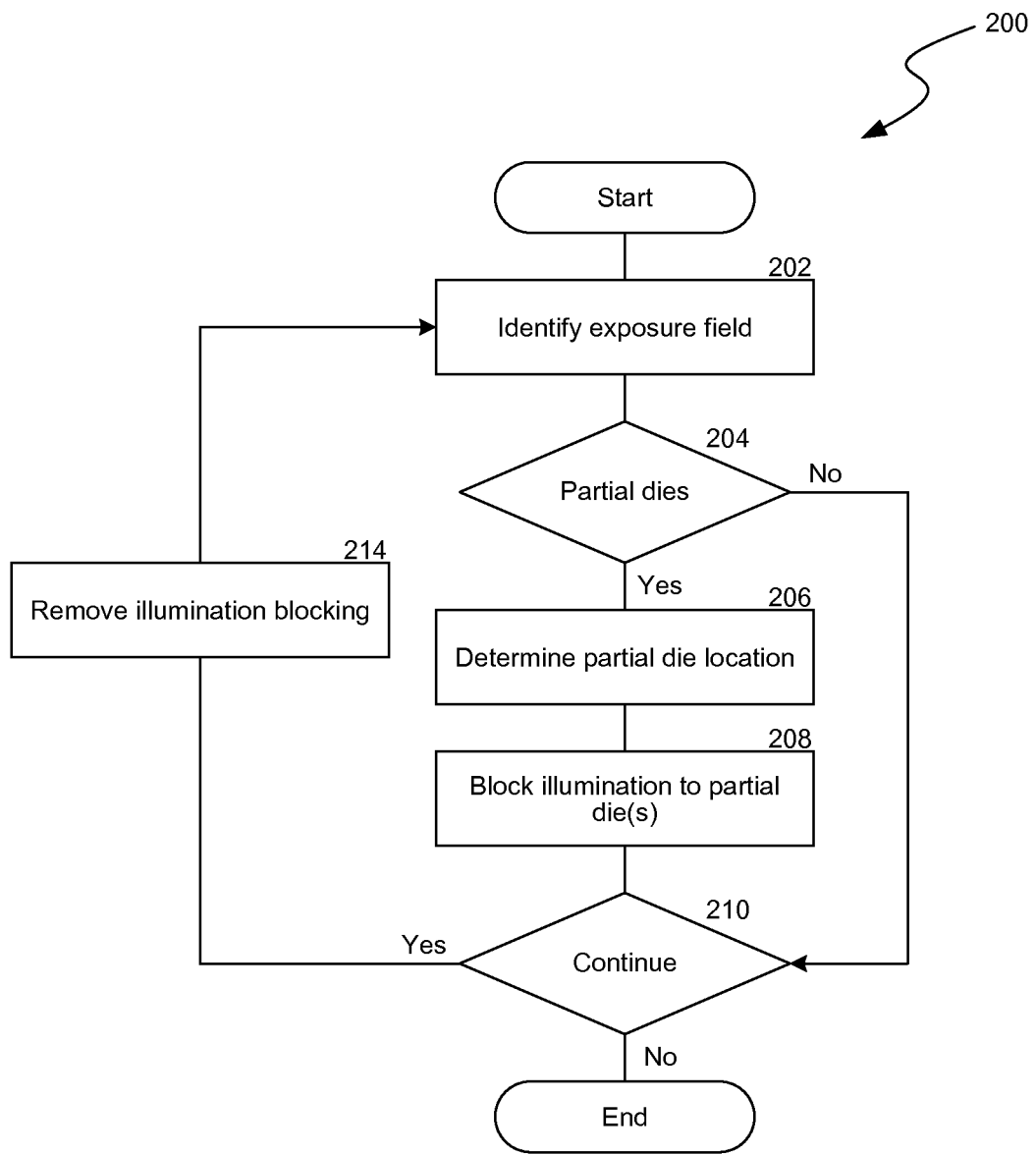
FIG. 5 is a flowchart showing a method for processing a microelectronic substrate in a photolithography system in accordance with embodiments of the disclosure.

FIG. 5 is a flowchart showing a method 200 for processing a microelectronic substrate in a photolithography system in accordance with embodiments of the disclosure. As shown in FIG. 5, the method 200 includes identifying a field to be exposed (block 202). In certain embodiments, identifying the field can include determining a location of the field to be exposed on the microelectronic substrate based on an X-axis and Y-axis location of the substrate support 112 (FIG. 1) and/or other suitable information. In other embodiments, identifying the exposure field can include identifying a relative position between the reticle 108 (FIG. 1) and the microelectronic substrate 114 and/or the substrate support 112.

The method 200 can also include determining whether the identified field includes at least one partial region (block 204). In one embodiment, the determination can be based on the location of the field on the microelectronic substrate 114. In another embodiment, the determination can be based on a flag in the workpiece map stored in the memory 122 (FIG. 1). In other embodiments, the determination can be based on operator input and/or other suitable information.

If the identified field includes at least one partial regions, the process continues to determining locations of the individual partial regions. In one embodiment, determining the locations of the individual partial regions can be based on a current location of the substrate support 112 and the workpiece map 144 stored in the memory 122. In other embodiments, determining the locations of the individual partial regions can be based on other suitable information.

The method 200 can then include at least attenuating, inhibiting, or blocking an illumination radiation from exposing the area of the microelectronic substrate 114 corresponding to the partial regions while allowing the illumination radiation to reach the normal regions in the field (block 208). The method 200 then continues on to another decision stage (block 210) to determine whether the process should continue. If yes, the process continues to removing all illumination blocking (block 214) before reverting to the stage of identifying another field to be exposed at block 202; otherwise, the process ends.

From the foregoing, it will be appreciated that specific embodiments of the disclosure have been described herein for purposes of illustration, but that various modifications may be made without deviating from the disclosure. For example, many of the elements of one embodiment may be combined with other embodiments in addition to or in lieu of the elements of the other embodiments. Accordingly, the disclosure is not limited except as by the appended claims.

We claim:

1. A photolithography system, comprising:
   a radiation source configured to provide an illumination radiation;
   a substrate support spaced apart from the radiation source, the substrate support being configured to support a microelectronic substrate divided into a plurality of fields individually having a plurality of regions, an individual region corresponding to a die and/or other microelectronic device, a firs region corresponding to a normal region not intersecting with a peripheral edge of the microelectronic substrate and a second region corresponding to a partial region intersecting with the peripheral edge of the microelectronic substrate;
   a programmable radiation filter between the radiation source and the microelectronic substrate; and
   a controller operatively coupled to the radiation source, the substrate support, and the programmable radiation filter, the controller having a computer-readable storage medium containing instructions for performing a process comprising exposing the first region of a field to the illumination radiation while selectively blocking a second region of the field from the illumination radiation, the blocked second region having an outline that generally follows a corresponding outline of the die and/or other microelectronic device of the partial region.

2. The photolithography system of claim 1 wherein the programmable radiation filter includes a liquid crystal panel having a plurality of addressable pixels, and wherein the photolithography system further includes a position transmitter operatively coupled to the substrate support, and further wherein the instructions for performing the process further include:
   determining a location of the individual first and second regions based at least in part on input from the position transmitter;
   determining a first set of pixels corresponding to the first region of the field based on the determined location of the first region;
   determining a second set of pixels corresponding to the second region of the field based on the determined location of the second region; and
   causing the first set of pixels to transmit the illumination radiation while causing the second set of pixels to generally prevent transmission of the illumination radiation.

3. The photolithography system of claim 1 wherein the programmable radiation filter includes a liquid crystal panel having a plurality of addressable pixels, and wherein the instructions for performing the process further include:
   determining a first set of pixels corresponding to the first region of the field;
   determining a second set of pixels corresponding to the second region of the field; and
   causing the first set of pixels to be transparent while causing the second set of pixels to be generally opaque.

4. The photolithography system of claim 1 wherein exposing the first region of the field includes:
- determining a first area of the programmable radiation filter that corresponds to the first region of the field;
- determining a second area of the programmable radiation filter that corresponds to the second region of the field; and
- independently controlling the first and second areas such that the first area is transparent while the second area is generally opaque.

5. A photolithography system, comprising:
- a radiation source configured to provide an illumination radiation;
- a substrate support spaced apart from the radiation source, the substrate support being configured to support a microelectronic substrate divided into a plurality of fields individually having a plurality of regions individually corresponding to a die and/or other microelectronic device, wherein a first region corresponds to a normal region not intersecting with a peripheral edge of the microelectronic substrate and a second region corresponds to a partial region intersecting with the peripheral edge of the microelectronic substrate; and
- a controller operatively coupled to the radiation source and the substrate support, the controller having a computer-readable storage medium having a map containing location information of the individual regions of the plurality of fields on the microelectronic substrate, the computer-readable storage medium also including instructions for performing a process comprising determining whether one of the plurality of fields includes at least one region intercepted by a peripheral edge of the microelectronic substrate based at least in part on the stored map, the instructions being capable of selectively inhibiting the illumination radiation from exposing at least one second region, the selectively inhibited second region having an outline that generally follows a corresponding outline of the die and/or other microelectronic device of the second region.

6. The photolithography system of claim 5 wherein determining whether one of the plurality of fields includes determining whether one of the plurality of fields includes at least one region intercepted by the peripheral edge of the microelectronic substrate based at least in part on the stored map and a current location of the microelectronic substrate.

7. The photolithography system of claim 5 wherein determining whether one of the plurality of fields includes determining whether one of the plurality of fields includes at least one region intercepted by the peripheral edge of the microelectronic substrate based at least in part on the stored map and a current location of the one field on the microelectronic substrate.

8. The photolithography system of claim 7 wherein the instructions for performing the process include:
- when one of the plurality of fields does not include at least one region intercepted by the peripheral edge of the microelectronic substrate, exposing all regions of the one of the plurality of fields to the illumination radiation from the radiation source.

9. A method for exposing a microelectronic substrate in a photolithography system, the method comprising:
- identifying a field on the microelectronic substrate to be exposed, the field being partitioned into a plurality of regions individually corresponding to a die and/or other microelectronic device, wherein a first region corresponds to a normal region not intersecting with a peripheral edge of the microelectronic substrate and a second regions corresponds to a partial region intersecting with the peripheral edge of the microelectronic substrate;
- determining whether the field includes a region that is intercepted by a peripheral edge of the microelectronic substrate; and
- when the field includes a region that is intercepted by the peripheral edge of the microelectronic substrate, selectively inhibiting an illumination radiation from exposing the intercepted region while exposing other regions to the illumination radiation, the other regions being not intercepted by the peripheral edge of the microelectronic substrate, the selectively inhibited region having an outline that generally corresponds to the die and/or other microelectronic device of the region.

10. The method of claim 9 wherein selectively inhibiting an illumination radiation includes:
- positioning a liquid crystal panel between a radiation source and the microelectronic substrate; and
- selectively controlling the liquid crystal panel to inhibit the illumination radiation from exposing the intercepted region of the field.

11. The method of claim 9 wherein selectively inhibiting an illumination radiation includes:
- positioning a liquid crystal panel between a radiation source and the microelectronic substrate, the liquid crystal panel including a plurality of pixels;
- selectively causing a subset of the plurality of pixels to be generally opaque to the illumination radiation, the subset of the plurality of pixels generally corresponding to the intercepted region; and
- inhibiting the illumination radiation from exposing the intercepted region of the field with the opaque pixels.

12. The method of claim 9 wherein selectively inhibiting an illumination radiation includes:
- positioning a liquid crystal panel between a radiation source and the microelectronic substrate, the liquid crystal panel including a plurality of pixels, wherein a first set of the pixels generally corresponds to the intercepted region, and wherein a second set of pixels generally corresponds to other regions not intercepted by the peripheral edge of the microelectronic substrate;
- causing the first set of pixels to be generally opaque to the illumination radiation while causing the second set of pixels to be generally transparent; and
- blocking the illumination radiation from exposing the intercepted region of the field with the opaque first set of pixels.

13. The method of claim 9 wherein selectively inhibiting an illumination radiation includes:
- positioning a liquid crystal panel between a radiation source and the microelectronic substrate, the liquid crystal panel including a plurality of pixels, wherein a first set of pixels generally corresponds to the intercepted region, and wherein a second set of pixels generally corresponds to other regions not intercepted by the peripheral edge of the microelectronic substrate;
- causing the first set of pixels to be generally opaque to the illumination radiation while causing the second set of pixels to be generally transparent; and
- blocking the illumination radiation from exposing the intercepted region of the field with the opaque first set of pixels while exposing the other regions not intercepted by the peripheral edge of the microelectronic substrate to the illumination radiation.

14. The method of claim 9, further comprising when the field does not include a region that is intercepted by the peripheral edge of the microelectronic substrate, exposing all regions of the field to the illumination radiation.

15. The method of claim 9, further comprising:
positioning a liquid crystal panel between a radiation source and the microelectronic substrate, the liquid crystal panel including a plurality of pixels; and
when the field does not include at least one region that is intercepted by the peripheral edge of the microelectronic substrate, causing the pixels of the liquid crystal panel to be generally transparent to the illumination radiation.

16. A method for exposing a microelectronic substrate in a photolithography system, the method comprising:
producing an illumination radiation from a radiation source, the illumination radiation having a desired exposure intensity for forming a pattern on the microelectronic substrate;
identifying a field on the microelectronic substrate to be exposed, the field being partitioned into a first region and a second region discrete from the first region, an individual region corresponding to a die and/or other microelectronic device, the first region not being intersected with a peripheral edge of the microelectronic substrate and a second region being intersected with the peripheral edge of the microelectronic substrate; and
reducing an intensity of the illumination radiation of the second region to a level less than the desired exposure intensity for forming the pattern in the first region while simultaneously exposing the first region to the illumination radiation at the desired exposure intensity, wherein the second region has an outline that generally corresponds to the die and/or other microelectronic device of the second region.

17. The method of claim 16 wherein reducing an intensity of the illumination radiation includes reducing the intensity of the illumination radiation to the second region to approximately zero while simultaneously exposing the first region to the illumination radiation.

18. The method of claim 16 wherein reducing an intensity of the illumination radiation includes controlling a programmable radiation filter to reduce the intensity of the illumination radiation to the second region to approximately zero while simultaneously exposing the first region to the illumination radiation, the programmable radiation filter being positioned between the radiation source and the microelectronic substrate.

19. A photolithography system, comprising:
a radiation source configured to produce an illumination radiation;
a reticle having a pattern;
a substrate support for holding a microelectronic substrate divided into a plurality of fields individually partitioned into a plurality of regions, an individual region corresponding to a die and/or other microelectronic device, the first region not being intersected with a peripheral edge of the microelectronic substrate and a second region being intersected with the peripheral edge of the microelectronic substrate, wherein the radiation source is configured to expose the individual fields with the illumination radiation and print a copy of the pattern on the individual fields; and
means for inhibiting the illumination radiation from exposing the second region of a field while exposing the first region of the field to the illumination radiation, wherein the second region has an outline that generally corresponds to the die and/or other microelectronic device of the second region.

20. The photolithography system of claim 19 further comprising means for determining whether the second region is intercepted by a peripheral edge of the microelectronic substrate.

* * * * *

UNITED STATES PATENT AND TRADEMARK OFFICE
CERTIFICATE OF CORRECTION

| | | |
|---|---|---|
| PATENT NO. | : 8,547,526 B2 | Page 1 of 1 |
| APPLICATION NO. | : 12/419744 | |
| DATED | : October 1, 2013 | |
| INVENTOR(S) | : William A. Stanton et al. | |

It is certified that error appears in the above-identified patent and that said Letters Patent is hereby corrected as shown below:

In the Claims

In column 8, line 22, in Claim 1, delete "firs" and insert -- first --, therefor.

In column 10, line 1, in Claim 9, delete "regions" and insert -- region --, therefor.

Signed and Sealed this
Twenty-eighth Day of January, 2014

Michelle K. Lee
*Deputy Director of the United States Patent and Trademark Office*